United States Patent
Thackeray et al.

(10) Patent No.: US 8,703,383 B2
(45) Date of Patent: Apr. 22, 2014

(54) PHOTOSENSITIVE COPOLYMER AND PHOTORESIST COMPOSITION

(75) Inventors: James W. Thackeray, Braintree, MA (US); Emad Aqad, Northborough, MA (US); Su Jin Kang, Grafton, MA (US); Owendi Ongayi, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 42 days.

(21) Appl. No.: 13/298,761

(22) Filed: Nov. 17, 2011

(65) Prior Publication Data
US 2012/0129105 A1 May 24, 2012

Related U.S. Application Data

(60) Provisional application No. 61/414,528, filed on Nov. 17, 2010.

(51) Int. Cl.
- *G03F 7/039* (2006.01)
- *G03F 7/09* (2006.01)
- *G03F 7/20* (2006.01)
- *G03F 7/30* (2006.01)

(52) U.S. Cl.
USPC .......... 430/270.1; 430/271.1; 430/272.1; 430/311; 430/326; 430/905; 430/907; 430/910; 430/921; 430/925; 430/942; 526/242; 526/247; 526/251; 526/286; 526/292.3; 526/292.5; 526/292.6; 526/292.9; 526/292.95; 526/293; 526/294; 526/296; 526/334

(58) Field of Classification Search
None
See application file for complete search history.

(56) References Cited

U.S. PATENT DOCUMENTS

| | | | |
|---|---|---|---|
| 7,396,960 | B2 | 7/2008 | Iwabuchi et al. |
| 2004/0170918 | A1* | 9/2004 | Maesawa et al. .......... 430/270.1 |
| 2004/0175654 | A1 | 9/2004 | Yasunami et al. |
| 2004/0265747 | A1 | 12/2004 | Medeiros et al. |
| 2007/0003871 | A1 | 1/2007 | Kodama et al. |
| 2007/0219368 | A1 | 9/2007 | Iwabuchi et al. |
| 2007/0248908 | A1 | 10/2007 | Huang et al. |
| 2009/0142697 | A1* | 6/2009 | Watanabe et al. .......... 430/281.1 |
| 2009/0202946 | A1 | 8/2009 | Yamashita |
| 2009/0233223 | A1* | 9/2009 | Tachibana et al. ......... 430/270.1 |
| 2010/0248167 | A1* | 9/2010 | Konno .................... 430/326 |

FOREIGN PATENT DOCUMENTS

| | | | |
|---|---|---|---|
| EP | 1693705 | A2 | 8/2006 |
| JP | 2003177537 | A | 6/2003 |
| JP | 2006259509 | A | 9/2006 |
| JP | 2008065114 | A | 3/2008 |
| JP | 2010181857 | A | 8/2010 |

OTHER PUBLICATIONS

Machine-assisted English translation of JP 2008-65114 provided by JPO (2008).*
Machine-assisted English translation of JP 2006-259509 provided by JPO (2006).*
European Search Report; European Application No. 11188390.6; Date of Mailing; Jul. 2, 2012; 6 pages.
Japanese Patent No. 2003177537 A; Publication Date: Jun. 27, 2003; Abstract Only, 1 page.
Japanese Patent No. 2006259509 A; Publication Date: Sep. 28, 2006; Abstract Only, 1 page.
Japanese Patent No. 2008065114 A; Publication Date: Mar. 21, 2008; Abstract Only, 1 page.
Japanese Patent No. 2010181857 A; Publication Date: Aug. 19, 2010; Abstract Only, 1 page.

* cited by examiner

*Primary Examiner* — Sin J. Lee
(74) *Attorney, Agent, or Firm* — Cantor Colburn LLP

(57) ABSTRACT

A copolymer has formula:

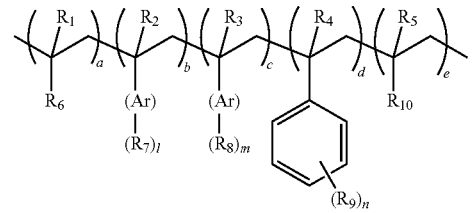

wherein $R_1$-$R_5$ are independently H, $C_{1-6}$ alkyl, or $C_{4-6}$ aryl, $R_6$ is a fluorinated or non-fluorinated $C_{5-30}$ acid decomposable group; each Ar is a monocyclic, polycyclic, or fused polycyclic $C_{6-20}$ aryl group; each $R_7$ and $R_8$ is —$OR_{11}$ or —$C(CF_3)_2OR_{11}$ where each $R_{11}$ is H, a fluorinated or non-fluorinated $C_{5-30}$ acid decomposable group, or a combination; each $R_9$ is independently F, a $C_{1-10}$ alkyl, $C_{1-10}$ fluoroalkyl, $C_{1-10}$ alkoxy, or a $C_{1-10}$ fluoroalkoxy group; $R_{10}$ is a cation-bound $C_{10-40}$ photoacid generator-containing group, mole fractions a, b, and d are 0 to 0.80, c is 0.01 to 0.80, e is 0 to 0.50 provided where a, b, and d are 0, e is greater than 0, the sum a+b+c+d+e is 1, l and m are integers of 1 to 4, and n is an integer of 0 to 5. A photoresist and coated substrate, each include the copolymer.

20 Claims, No Drawings

PHOTOSENSITIVE COPOLYMER AND PHOTORESIST COMPOSITION

CROSS-REFERENCE TO RELATED APPLICATION

This application is a nonprovisional of U.S. Provisional Application No. 61/414,528, filed on Nov. 17, 2010, the content of which is incorporated by reference herein in its entirety.

BACKGROUND

Disclosed herein is a photosensitive copolymer and a photoresist composition which includes the copolymer.

Design rules for advanced generation microlithography (i.e., beyond 193 nm immersion lithography and into next generation optics such as e-beam, X-ray, and extreme ultraviolet (EUV) lithography operating at a very short wavelength of 13.5 nm) are trending toward smaller and smaller dimensions, for example, 30 nm and below. In general, depth of focus (DOF) necessarily decreases with higher resolution due to the higher numerical aperture (NA) and therefore resist thickness also decreases commensurate to the smaller and smaller feature sizes. With narrower linewidths and thinner resist films, consistency issues such as line width roughness (LWR) and resolution take on increasing significance limiting the performance and usefulness of photoresists. These phenomena are of interest in the fabrication of semiconductor devices; for example, excessive LWR can lead to poor etch and lack of linewidth control in, for example, transistor and gate architecture, potentially causing short circuits and signal delay.

U.S. Patent Application Publication No. 2009/0202946 discloses polymers for use in photoresists based on hydroxystyrene-containing copolymers having low activation energy (i.e., acetal and/or ketal) acid-sensitive groups, or (meth)acrylate based copolymers having bulky cycloalkyl acid-sensitive groups, which further include functionality (such as aliphatic hydroxy groups or lactone moieties) to provide surface adhesion properties. For certain acetal groups, photoresists including the exemplary copolymers disclosed in the '946 application exhibit fine pattern imaging, desirable sensitivity and exposure latitude, as well as aging stability; however, no LWR performance or improvement in LWR is disclosed.

Polymers with PAGs bonded to them provide desirable imaging properties. However, the presence of polymer bound PAG can also introduce very high polarity in and swelling of the photoresists, which can in turn introduce low mechanical strength and photoresist failure by pattern collapse for critical dimensions (CD) at narrow linewidths of 30 nm or less.

STATEMENT OF INVENTION

One or more of the above and other deficiencies of the prior art may be overcome by, in an embodiment, a copolymer having the formula:

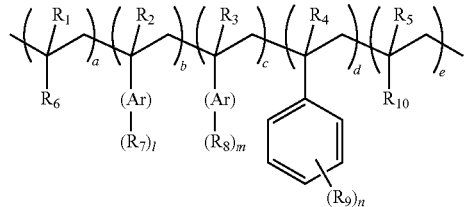

wherein $R_1$-$R_5$ are each independently H, $C_{1-6}$ alkyl, or $C_{4-6}$ aryl, $R_6$ is a fluorinated or non-fluorinated $C_{5-30}$ acid decomposable group; each Ar is independently a monocyclic, polycyclic, or fused polycyclic $C_{6-20}$ aryl group; each of $R_7$ and $R_8$ is independently —$OR_{11}$ or a —$C(CF_3)_2OR_{11}$ group where each occurrence of $R_{11}$ is independently H, a fluorinated or non-fluorinated $C_{5-30}$ acid decomposable group, or a combination of these; each $R_9$ is independently F, a $C_{1-10}$ alkyl, $C_{1-10}$ fluoroalkyl, $C_{1-10}$ alkoxy, or a $C_{1-10}$ fluoroalkoxy group; $R_{10}$ is a cation-bound $C_{10-40}$ photoacid generator-containing group, mole fractions a, b, and d are independently 0 to 0.8, mole fraction c is 0.01 to 0.80, e is 0 to 0.50 provided that where a, b, and d are 0, e is greater than 0, the sum of the mole fractions a+b+c+d+e is 1, l and m are independently integers of 1 to 4, and n is an integer of 0 to 5.

In another embodiment, a photoresist composition comprises a copolymer as described above; a photo-destroyable base; a solvent; and optionally, a non-polymer bound photoacid generator.

In another embodiment, a coated substrate comprises a copolymer as described above; a photo-destroyable base; and optionally, a non-polymer bound photoacid generator; wherein the photoresist layer is in contact with a surface of a substrate.

DETAILED DESCRIPTION

Disclosed herein are copolymers for use in high energy lithography such as extreme ultraviolet (EUV) lithography, with an emission wavelength of 13.5 nm. The copolymers include ionic photoacid generators (PAGs) bound to polymers preferably through the cation through a tethering group, and ester, acetal- or ketal-based acid-sensitive protecting groups, sometimes referred to herein as "leaving groups," which mask a base-reactive functional group such as, for example, a carboxylic acid group, phenolic group, or hexafluoroisopropanol group. The copolymers may include narrow polydispersity (i.e., Mw/Mn≤1.5) polydisperse polymers containing aryl groups (e.g., styrene), large (e.g., ≥10 carbon atom) acetal groups as the acid-sensitive leaving groups, and acid-scissionable or non-scissionable cation-bound PAGs bound to the copolymer.

As used herein, "copolymer" includes a polymer having two or more different monomeric units, and includes copolymers having two monomeric units, terpolymers having three monomeric units, tetrapolymers having four monomeric units, pentapolymers having five monomeric units, etc. It will also be appreciated that the copolymers disclosed herein may be random copolymers, block copolymers, alternating copolymers, or a combination including two or more of these motifs. Preferably, the copolymers are random copolymers, where no particular order of the monomers is implied by the formulas. As used herein, an "aryl" is an aromatic group and may be monocyclic, for example, a phenyl group; polycyclic, for example, a biphenyl group; or fused polycyclic, for example, a naphthyl group, and it will be understood that "aryl" includes all aromatic structures including those of fewer than 6 carbon atoms such as heteroaromatic compounds including pyrazoles, thiophenes, oxazoles, pyridines, etc. Also as used herein, an "alkyl" group is a $sp^3$ hybridized carbon containing group and may be linear or branched, and may include cycloalkyl unless otherwise specified. Further, "cation-bound" means that an organic tethering group, e.g., an alkyl, aryl, alkoxy, polyalkoxy, acetal or ketal-containing group, or other appropriate group, forms a covalently bonded structure between the cation of the PAG and the polymer, where it will be recognized that the cation of the PAG is an organic molecule containing a positively charged heteroatom such as sulfonium (sulfur) or iodonium (iodine). Also as used herein, "substituted" means including a substituent such as a halogen (i.e., F, Cl, Br, I), hydroxy, amino, thiol, carboxyl, carboxylate, amide, nitrile, thiol, sulfide, disulfide, nitro, a $C_{1-10}$ alkyl, a $C_{1-10}$ alkoxy, a $C_{6-10}$ aryl, a $C_{6-10}$ aryloxy, a $C_{7-10}$ alkyl aryl, a $C_{7-10}$ alkyl aryloxy, or a combination comprising at least one of the foregoing. It will be understood that any group or structure disclosed with respect to the formulas herein may be so substituted unless otherwise specified, or where such substitution would significantly adversely affect the desired properties of the resulting structure.

In some embodiments, only acetal groups used as the acid-sensitive leaving groups; in other embodiments, a combination of acetal groups and high activation energy leaving groups (e.g., tertiary alkyl esters) are included in the copolymer. Preferably, the copolymer contains fluorinated substituents on the acetal leaving groups and/or the monomers comprising the backbone of the copolymer. The copolymers incorporating both cation-bound PAGs and low activation energy acetal polymers can provide one or more of improved resolution, LWR and collapse margin, as well as desirable etch resistance, good polymer and hence photoresist lot-to-lot consistency, fast photospeed (e.g., <10 millijoules per square centimeter ($mJ/cm^2$)), particularly with short wavelength/high energy lithographies such as e-beam, extreme ultraviolet (EUV) and X-ray, and improved resolution.

Photoresists prepared using the copolymers include solvents and additives including photobases and surfactants. Optionally, an additional photoacid generator not bound to the copolymer may be included.

The photoresist includes a copolymer having acid sensitive leaving groups located on monomeric moieties of the copolymer and protecting a functional group which, upon removal of the acid sensitive leaving group, becomes a base-reactive functional group such as, for example, a phenolic hydroxy group, a carboxylic acid group, or a hydroxy hexafluoroisopropylidene group.

In an embodiment, the copolymer has the formula (1):

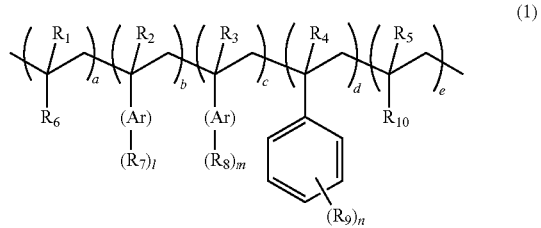

(1)

In formula (1), backbone substituent groups $R_1$-$R_5$ are each independently H, $C_{1-6}$ alkyl, or $C_{4-6}$ aryl. Preferably, each of $R_1$-$R_5$ is independently H or $CH_3$.

Also in formula (1), $R_6$ is a fluorinated or non-fluorinated $C_{5-30}$ acid decomposable group, in which the acid decomposable group may be based on a high activation energy leaving group, i.e., one in which the decomposition of the leaving group is effected upon a combination of exposure to a strong acid (pKa>1) and heating of the polymer at a temperature higher than ambient temperature, for example, greater than or equal to 70° C., or where the acid decomposable group may be based on a low activation energy leaving group, i.e., one in which the decomposition of the leaving group is effected upon exposure to a strong acid at ambient temperature. In an embodiment, a tertiary alkyl ester group may be used where the fluorinated or non-fluorinated $C_{5-30}$ acid decomposable group of $R_6$ is a high activation energy group.

Each Ar is independently a monocyclic, polycyclic, or fused polycyclic $C_{6-20}$ aryl group. Exemplary Ar groups include phenyl, biphenyl, triphenyl, naphthyl, anthracyl, phenanthryl, and alkyl-aryl groups such as alkylphenyl groups and cyclohexylphenyl groups. Preferably, Ar is phenyl or naphthyl. It will be appreciated that each Ar group may be unsubstituted, or may be substituted with substituent groups $R_7$ and $R_8$, each of which is independently —$OR_{11}$ or a —$C(CF_3)_2OR_{11}$ group in which each occurrence of $R_{11}$ is independently H, a fluorinated or non-fluorinated $C_{5-30}$ acid decomposable group, or a combination of these. Preferably, $R_{11}$ is H or an acid decomposable acetal group comprising a fluorinated or non-fluorinated $C_{6-25}$ aryl group or a fluorinated or non-fluorinated $C_{6-25}$ cycloalkyl group. As used herein, "cycloalkyl" means monocyclic, polycyclic (where "poly" means two or more), or fused polycyclic alkyl group including bicyclo, tricyclo, etc., groups. More preferably, where groups $R_7$ and/or $R_8$ is a —$C(CF_3)_2OR_{11}$ group, $R_{11}$ is more preferably H or an acid decomposable methylene acetal group comprising a fluorinated or non-fluorinated —$CH_2$—($C_{6-25}$ aryl) group or a fluorinated or non-fluorinated —$CH_2$—($C_{6-25}$ cycloalkyl) group.

Each $R_9$ is independently F, a $C_{1-10}$ alkyl, $C_{1-10}$ fluoroalkyl, $C_{1-10}$ alkoxy, or a $C_{1-10}$ fluoroalkoxy group, or a combination comprising at least one of the foregoing. Exemplary such $R_9$ groups include —F, —$CH_3$, —$CF_3$, —$OCH_3$, —$OCF_3$, —$CH_2CF_3$, —$OCH_2CF_3$, or a combination comprising at least one of the foregoing.

$R_{10}$ is a cation-bound $C_{10-40}$ photoacid generator-containing group. In one embodiment, $R_{10}$ is derived from the (meth)acrylate ester of a photoacid generator derivatized through the cation. As used herein, "(meth)acrylate" means acrylate or methacrylate, which unless otherwise indicated may be considered interchangeable homologues of the corresponding addition-polymerizable groups (i.e., polymerizable by radical initiation, anionic polymerization, cationic polymerization, transition-metal mediated addition polymerization, or controlled free radical polymerization techniques). In another embodiment, $R_{10}$ is derived from the polymer-bound reaction product of the vinyl ether of a photoacid generator derivatized through the cation, with a hydroxyphenyl group as point of attachment to the polymer chain. Such (meth)acrylate ester or vinyl ether derived photoacid generators may be acid-scissionable, i.e., may be cleaved by acid from the polymer chain, and may therefore also double as acid-sensitive leaving groups. These photoacid generator-containing groups will be discussed in greater detail below.

Also in formula (1), mole fractions a, b and d are independently 0 to 0.80, mole fraction c is 0.01 to 0.80, e is 0 to 0.50, the sum of the mole fractions a+b+c+d+e is 1, l and m are independently integers of 1 to 4, and n is an integer of 0 to 5. In one embodiment, e is 0 and the copolymer does not include a cation-bound photoacid generator. In another embodiment, e is greater than 0 and the copolymer includes a cation-bound photoacid generator. In a specific embodiment, e is 0.01 to 0.50. Preferably, where a is 0, $R_7$ and $R_8$ each include different groups —$OR_{11}$ or a —$C(CF_3)_2OR_{11}$ group in which each occurrence of $R_{11}$ is independently H, a fluorinated or non-fluorinated $C_{5-30}$ acid decomposable group. Also, where mole fractions a, b, and d are 0, e is greater than 0. In this instance, $R_{10}$ comprises an acid-scissionable cation-bound photoacid generator, preferably one derived from a vinyl ether.

Furthermore, it will be understood that more than one $R_7$, $R_8$, and/or $R_9$ group may be included, so that the mole fractions b, c, and d may include more than one monomeric unit. To illustrate this, for example, $R_7$ may represent both an —OH and an —OH group that has been protected by an acid decomposable acetal leaving group (e.g., having a generic structure —O—$CH(R_a)$—O—$R_b$ where $R_a$ may be a methyl, ethyl, or other alkyl group, and $R_b$ is a fluorinated or non-fluorinated cycloalkyl group or a fluorinated or non-fluorinated aryl group). In such an instance, integer l would be 1, and the mole fraction b thus may represent two different monomers differing in the substituent $R_7$, where the sum of these monomers equals mole fraction b. The same substitution scheme may be applied to $R_7$, $R_8$, and $R_9$, with regard to mole fractions b, c, and d, and to integers, l, m, and n.

Preferably, where $R_7$ and $R_8$ each represent two groups, $R_7$ and $R_8$ may each be a combination of —OH and/or —OH groups that has been protected by an acetal leaving group (e.g., having a generic structure —O—CH($R_a$)—O—$R_b$ where $R_a$ may be a methyl, ethyl, or part of a cyclic group such as a 5 or 6-membered heterocyclic ring connecting $R_a$ to $R_b$, or other alkyl group, and $R_b$ is a fluorinated or non-fluorinated cycloalkyl group or a fluorinated or non-fluorinated aryl group), or where the $R_b$ groups are not identical for $R_7$ and $R_8$. More preferably, $R_b$ in $R_7$ may be a combination of a fluorinated or non-fluorinated $C_{5-25}$ cycloalkyl-containing group and a fluorinated or non-fluorinated $C_{6-25}$ aryl-containing group, and $R_b$ in $R_8$ may be an —OH group or —C(CF$_3$)$_2$OH group.

In an embodiment, in formula (1) where a is not 0, the fluorinated or non-fluorinated $C_{5-30}$ acid decomposable group of $R_6$ is a tertiary alkyl or cycloalkyl ester group, an aryl substituted tertiary alkyl ester group, or a benzylic aryl-containing group. $R_6$ may be preferably the carboxylic ester of a fluorinated or non-fluorinated $C_{4-20}$ alkyl group, a fluorinated or non-fluorinated $C_{4-20}$ cycloalkyl-containing group, or of a fluorinated or non-fluorinated $C_{6-20}$ aryl-alkyl-containing group. As used herein, "aryl alkyl" means a group which contains both an aryl moiety and an alkyl moiety, where either the aryl or the alkyl group is the point of attachment to the ester group. Where an alkyl or cycloalkyl group is used, the ester oxygen attaches to a tertiary alkyl center, though not a bridgehead carbon center (e.g., a 1-adamantyl group). Preferably, where an aryl alkyl group is used, the alkyl portion is the point of attachment to the ester oxygen and intervenes between the aryl portion and the carboxylate ester. More preferably, where a fluorinated or non-fluorinated $C_{6-20}$ aryl alkyl-containing group is used, the oxygen of the ester group connects to a tertiary alkyl carbon or to a benzylic carbon (i.e., a carbon atom alpha to the aryl group). Exemplary alkyl-containing groups include t-butyl, 2-methyl-2-butyl, 2-methyl-2-pentyl, and 3-methyl-3-pentyl. Exemplary cycloalkyl-containing groups include 1-methylcyclopentyl, 1-ethylcyclopentyl, 1-methylcyclohexyl, 1-ethylcyclohexyl, 1-(1-adamantyl)ethyl, and 2-methyladamantyl groups.

In another embodiment, where a is greater than or equal to 0, $R_{11}$ in formula (1) (based on functional groups $R_7$ and $R_8$) may be a fluorinated or non-fluorinated $C_{5-30}$ acid decomposable group derived from a vinyl ether group.

In a specific embodiment, where a is 0, the copolymer may be of the formula (2):

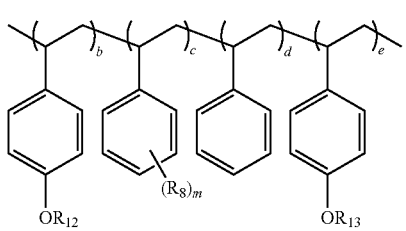

(2)

where $R_{12}$ is an acid decomposable acetal group including a fluorinated or non-fluorinated $C_{6-25}$ aryl group, a fluorinated or non-fluorinated $C_{6-25}$ cycloalkyl group, or a combination comprising at least one of the foregoing, $R_8$ is —OH or —C(CF$_3$)$_2$OH, $R_{13}$ is a cation-bound $C_{10-35}$ acetal- or ketal-linked photoacid generator-containing group (where it will be understood that the acetal or ketal linkage intervenes between the polymer backbone and the cation), mole fraction b is 0 to 0.50, mole fraction c is 0.50 to 0.80, mole fraction d is 0 to 0.50, mole fraction e is 0 to 0.50, and the sum of the mole fractions b+c+d+e is 1. In a preferred copolymer of formula (2), mole fraction b is 0.10 to 0.50, mole fraction c is 0.50 to 0.80, mole fraction d is 0.05 to 0.30, mole fraction e is 0 to 0.40, and the sum of the mole fractions b+c+d+e is 1. In another preferred copolymer of formula (2), mole fraction b is 0.10 to 0.50, mole fraction c is 0.50 to 0.80, mole fraction d is 0.05 to 0.30, mole fraction e is 0.01 to 0.40, and the sum of the mole fractions b+c+d+e is 1. In still another preferred copolymer of formula (2), mole fraction b is 0 to 0.50, mole fraction c is 0.50 to 0.80, mole fraction d is 0 to 0.30, mole fraction e is 0.20 to 0.50, and the sum of the mole fractions b+c+d+e is 1.

In another specific embodiment, where a is greater than 0, the copolymer may be of the formula (3):

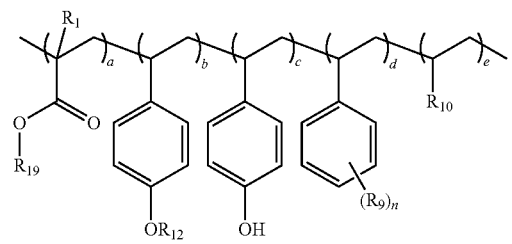

(3)

where $R_1$ and $R_{14}$ are independently H or $C_{1-4}$ alkyl, $R_{12}$ is an acid decomposable acetal group including a fluorinated or non-fluorinated $C_{6-25}$ aryl group, a fluorinated or non-fluorinated $C_{6-25}$ cycloalkyl group, or a combination comprising at least one of the foregoing, $R_{19}$ is a fluorinated or non-fluorinated $C_{4-20}$ tertiary alkyl, a fluorinated or non-fluorinated $C_{4-20}$ tertiary cycloalkyl, a fluorinated or non-fluorinated, tertiary or benzylic $C_{6-20}$ aryl alkyl, each $R_9$ is independently F, a $C_{1-10}$ alkyl, $C_{1-10}$ fluoroalkyl, $C_{1-10}$ alkoxy, or a $C_{1-10}$ fluoroalkoxy group; $R_{10}$ is a cation-bound $C_{10-40}$ photoacid generator-containing group, mole fractions a, and c are independently 0.01 to 0.80, b and d are independently 0 to 0.80, e is 0.01 to 0.50, the sum of the mole fractions a+b+c+d+e is 1, and n is an integer of 0 to 5.

In formulas (2) and (3), $R_{12}$ is an acetal group having the formulas:

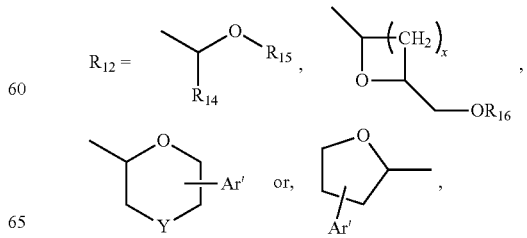

in which $R_{14}$ is H or $C_{1-4}$ alkyl, $R_{15}$ and $R_{16}$ are independently a $C_{2-20}$ alkyl, $C_{2-20}$ fluoroalkyl, $C_{5-20}$ cycloalkyl, $C_{5-20}$ fluorocycloalkyl, $C_{6-20}$ aryl, or $C_{6-20}$ fluoroaryl group, Ar' is a $C_{6-20}$ aryl group wherein the Ar' group is a pendant group or is fused to an acetal-containing ring, and Y is —O—, —CH$_2$—, or —C(=O)—. In formula (2), (formula (1) when e is 0), the monomeric units of mole fraction b comprise a combination of monomers having two or more different groups $R_{12}$.

It will be appreciated that the groups $R_{12}$ in formulas (2) and (3) may be derived from the corresponding vinyl ether by cross reaction of the vinyl ether with a phenolic —OH group. An illustrative example of a vinyl ether of a fluorinated or non-fluorinated $C_{6-25}$ cycloalkyl group includes the following structures.

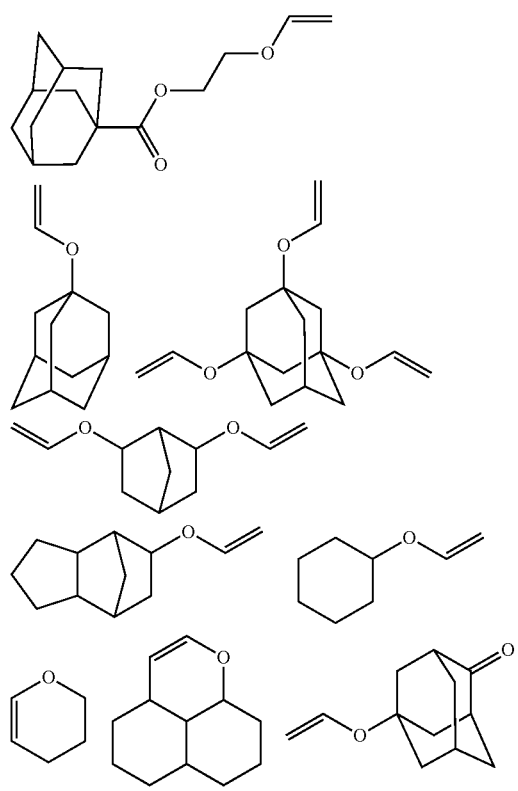

Preferably, useful cycloalkyls include polycyclic alkyls derived from adamantane. An exemplary cycloalkyl vinyl ether is the 2-vinyloxyethyl ester of 1-adamantane carboxylic acid. Cross-linking (e.g., bis- or tris-vinyl ether-containing) polycyclic aliphatic groups may also be included.

Illustrative, non limiting examples of electron-rich aromatic units useful in the invention include the following:

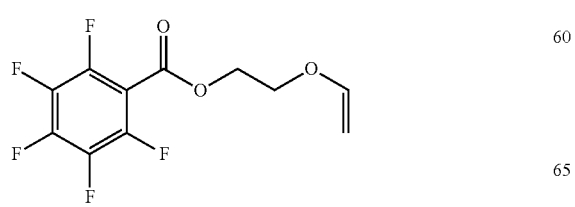

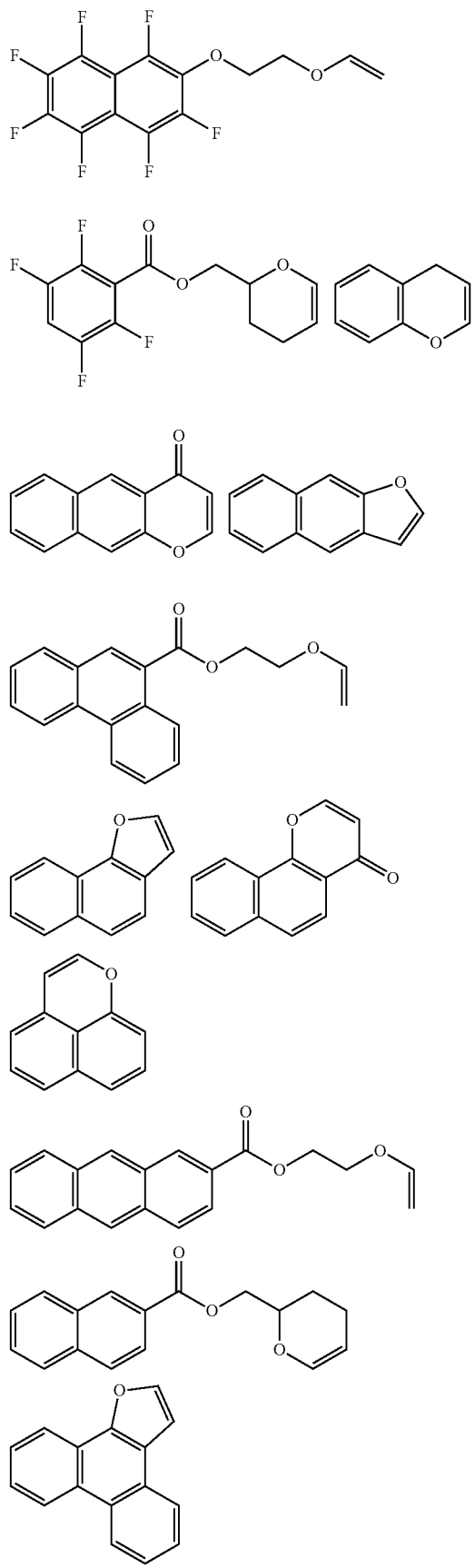

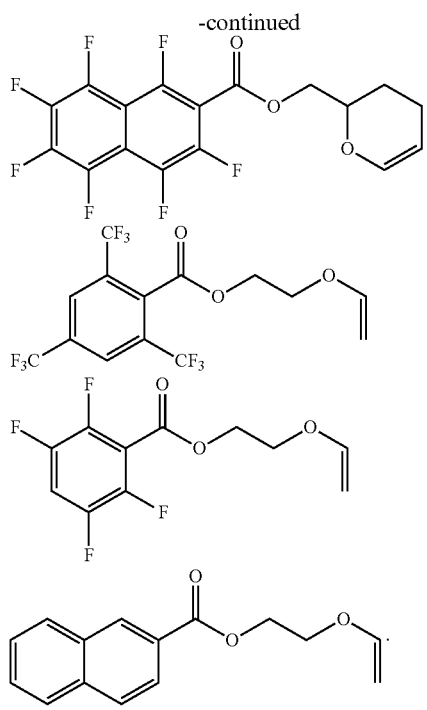

In an embodiment, the copolymer includes a cation-bound photoacid generator group, covalently linked to the polymer backbone. The cation-bound photoacid generator may be attached to a phenolic —OH group via a vinyl ether functional group attached to the PAG cation, or may be attached via an ester-containing linkage to a (meth)acrylate monomer copolymerized into the backbone. Preferably, when a vinyl ether is used, i.e., when e in formulas (1) or (3) is not 0, an $R_{10}$ group may be of the general formula:

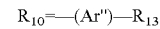

$$R_{10} = -(Ar'') - R_{13}$$

where Ar'' is a $C_{6-20}$ monocyclic, polycyclic, or fused polycyclic aryl group; $R_{13}$ is:

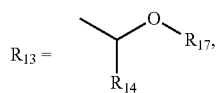

where $R_{14}$ is H or $C_{1-4}$ alkyl; and $R_{17}$ is:

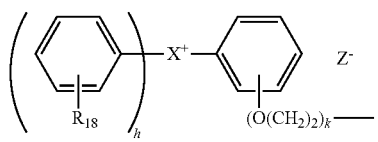

wherein $R_{18}$ is H or a $C_{1-10}$ organic group, X is S or I, and h is 2 when X is S, or h is 1 when X is I, k is 1 to 4, and Z is an anion.

Alternatively, when e in formula (1) or (3) is not 0 and a vinyl ether tethering group is not used, the $R_{10}$ group may be an ester (as the polymerization product of a corresponding (meth)acrylate) of the formula:

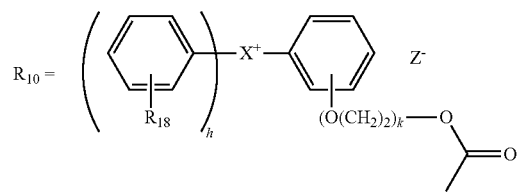

wherein $R_{18}$ is H or a $C_{1-10}$ organic group, X is S or I, and h is 2 when X is S, or h is 1 when X is I, k is 1 to 4, and Z is an anion.

In the above structures, preferred polymer bound cations include sulfonium cations such as those derived from vinyl ethers including diphenyl (4-(vinyloxy-ethoxy)phenyl)sulfonium cations.

In the above structures, anion Z may be any suitable anion capable of providing a corresponding acid after photolysis of the photoacid generator, having a pKa<2, and of sufficient acidity to catalyze the decomposition of any high or low activation energy protecting group. Preferably, Z is an anion containing a sulfonate, sulfonamide, or sulfonimide group. The anion may be a $C_{1-30}$ organic group containing a sulfonate, sulfonamide, or sulfonimide group, and more preferably, may be fluorinated to further decrease the pKa of an acid generated from the decomposition of the corresponding PAG.

Preferably, Z is the anion of a $C_{1-30}$ alkanesulfonic acid, $C_{3-30}$ cycloalkanesulfonic acid, $C_{1-30}$ fluorinated alkanesulfonic acid, $C_{3-30}$ fluorinated cycloalkanesulfonic acid, $C_{6-30}$ arylsulfonic acid, $C_{6-30}$ fluorinated arylsulfonic acid, $C_{7-30}$ alkylarylsulfonic acid, $C_{7-30}$ fluorinated alkylarylsulfonic acid, $C_{1-30}$ fluorinated alkanesulfonimide, $C_{2-30}$ fluorinated cycloalkanesulfonimide, $C_{6-30}$ fluorinated arylsulfonimide, $C_{7-30}$ alkylarylsulfonimide, $C_{7-30}$ fluorinated alkylarylsulfonimide, or a combination comprising at least one of the foregoing.

Preferred exemplary anions Z suitable for use in the photoresist include:

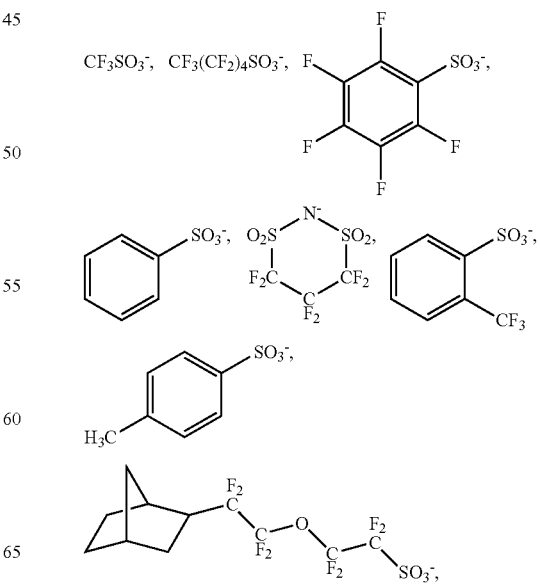

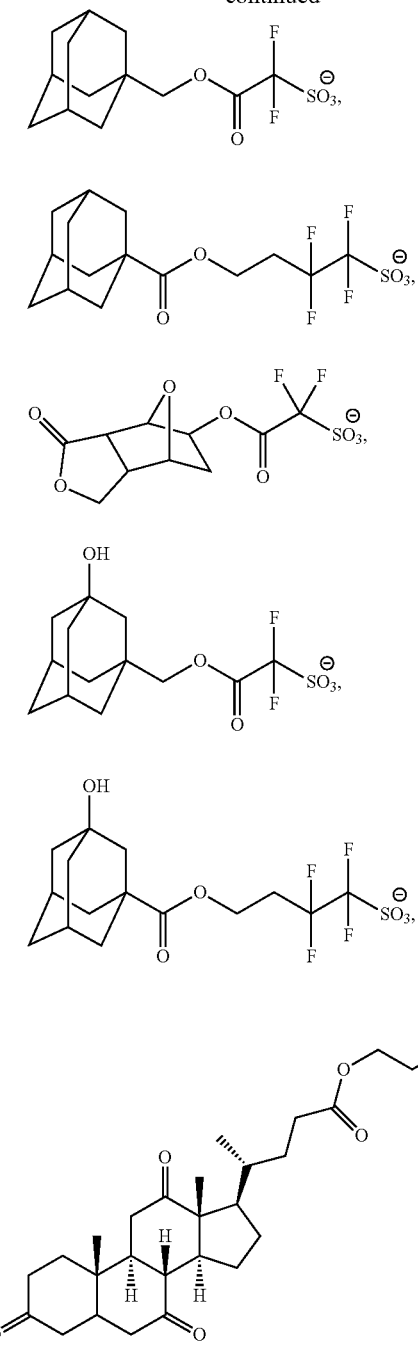

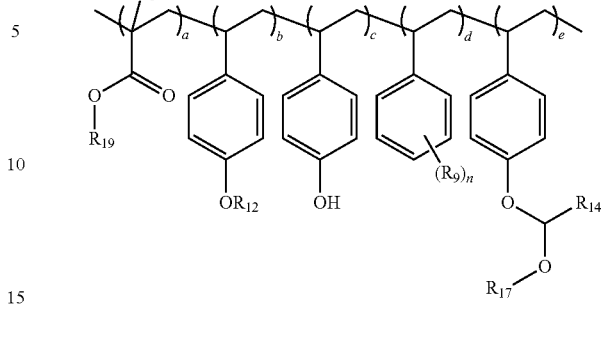

where $R_1$, $R_9$, $R_{12}$, $R_{19}$, mole fractions a-e, and n, are as defined for formula (3), and wherein $R_{14}$ and $R_{17}$ are as defined for formula (2).

In another specific embodiment, where a is not 0 and b is 0, the copolymers may be of the following formula (5):

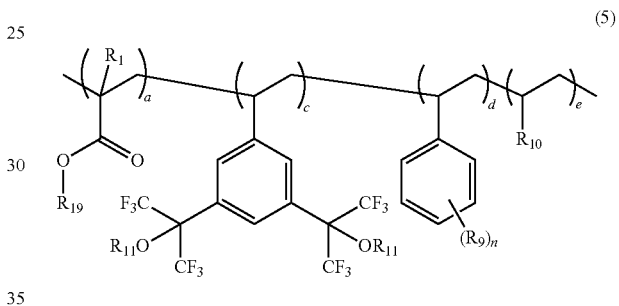

where $R_9$, $R_{10}$, $R_{19}$, a, c, d, e and n are as defined for formula (3), b is 0, and $R_{11}$ is as defined for formula (1).

In another specific embodiment, where a is not 0 and b is 0, the copolymer may be of the following formula (6):

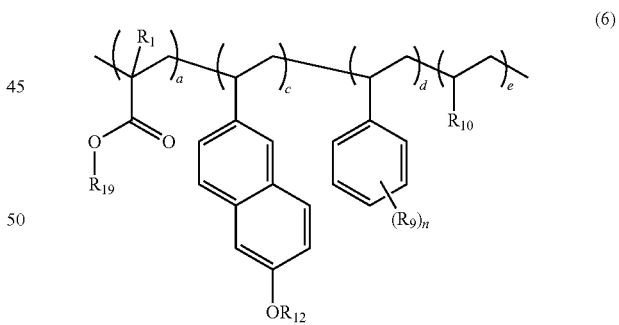

where $R_1$, $R_9$, $R_{10}$, $R_{12}$, $R_{19}$, a, c, d, e and n are as defined for formula (3), Ar as defined from formula (1) is a naphthyl ($C_{10}$ fused aryl), and b is 0.

The copolymers disclosed herein may have a weight average molecular weight (Mw) of 1,000 to 100,000, more specifically 1,500 to 50,000, still more specifically 2,000 to 20,000, and still more specifically 2,500 to 10,000. The copolymers disclosed herein may also have a number average molecular weight (Mw) of 1,000 to 100,000, more specifically 1,500 to 50,000, still more specifically 2,000 to 20,000, and still more specifically 2,500 to 10,000. The copolymers may further have a polydispersity of less than or equal to 4, Thus, an exemplary vinyl ether for polymer-bound PAGs include cation bound salts such as salts of diphenyl (4-(vinyloxy-ethoxy)phenyl)sulfonium and diphenyl (4-((meth)acryloxy-ethoxy)phenyl)sulfonium cations. Useful cation-bound PAGs which are acid scissionable include diphenyl (4-(vinyloxy-ethoxy)phenyl)sulfonium1,3-hexafluorotrimethylenebis(sulfonimide) salt and diphenyl (4-(vinyloxy-ethoxy)phenyl)sulfonium perfluorobutane sulfonate.

In another specific embodiment where a is not 0, the copolymer may have the structure of formula (4) (i.e., formula (1) in which $R_{10}$ includes a phenolic moiety):

specifically less than or equal to 3, and still more specifically less than or equal to 2. Preferably, the copolymers have a narrow polydispersity of less than 2, specifically less than or equal to 1.5, more specifically less than or equal to 1.4, and still more specifically less than or equal to 1.3. Molecular weight may be determined using gel permeation chromatography (GPC) using a crosslinked styrene-divinyl benzene column and tetrahydrofuran, methylene chloride, or toluene as an eluant, at a flow rate of about 1 ml/min and a sample concentration of about 1 mg/ml. The GPC is calibrated by universal calibration to polystyrene standards.

The copolymers, and the underivatized starting polymer from which the copolymers of some embodiments may be prepared by derivatization with vinyl ether groups, may themselves be prepared by any suitable solution polymerization method known in the art, including radical polymerization using peroxy or diazo initiators with or without controlled feed, controlled free radical polymerization (CFRP), anionic polymerization, or other suitable methods. It will be appreciated that methods which provide a narrow polydispersity polymer, such as polymerization using CFRP or anionic polymerization, or radical polymerization followed by post-polymerization fractionation to provide narrow polydispersity polymer fractions, are preferred. The copolymers, prepared using radical polymerization, may be prepared from the corresponding vinyl aromatic or (meth)acrylate monomers. Exemplary monomers useful to prepare the copolymers include, for monomers for mole fraction a in formula (1), (meth)acrylates such as t-butyl(meth)acrylate, 1-methylcyclopentyl (meth)acrylate, 1-ethylcyclopentyl(meth)acrylate, and 2-methyladamantyl(meth)acrylate; for monomers for mole fractions b, c, and e (where e is not 0 and where $R_{10}$ incorporates a vinyl ether moiety), o, m, or p-hydroxystyrene (reacted directly or derived from the corresponding t-butyl ether or acetyl ester); o, m, or p-(hydroxybishexafluoroisopropyl) vinyl benzene; 2,3-, 2,4-, 2,5-, 2,6-, 3,4-, or 3,5-bis (hydroxybishexafluoroisopropyl) vinyl benzene; 1,4-, 1,5-, 1,6-, 1,7-, 1,8-, 2,4-, 2,5-, 2,6-, or 2,7-, or 2,8-isomers of hydroxyvinyl naphthalene (reacted directly or derived from the corresponding t-butyl ether or acetyl ester); and for mole fraction e (where e is not 0 and $R_{10}$ in formula (1) comprises an ester group) a functionalizable (meth)acrylate such as (meth)acrylic acid, 2-hydroxyethyl(meth)acrylate, 2-hydroxypropyl(meth)acrylate, and 4-hydroxybenzyl(meth)acrylate. A combination comprising any one or more of the foregoing may be used. Preferred monomers include t-butyl(meth)acrylate, 1-ethylcyclopentyl(meth)acrylate, 2-methyladamantyl (meth)acrylate, 4-hydroxystyrene, 3,5-bis(hydroxybishexafluoroisopropyl) vinyl benzene, and 6-hydroxy-2-vinyl naphthalene. Combinations of these may be used.

Other (meth)acrylate monomers may be used in place of the vinyl monomers corresponding to mole fractions b and c, to impart additional properties such as enhanced base solubility, etch resistance, swelling resistance, and adhesion. Such monomers may include, for example, 1-(gammabutyrolactone) (meth)acrylate, 2-(gammabutyrolactone) (meth) acrylate, 3,5-bis(hydroxyfluoroisopropyl)cyclohexyl (meth)acrylate, 3-(hydroxyhexafluoroisopropyl)-4-hydroxycyclohexyl(meth)acrylate, 6-hydroxy-2-naphthylmethyl(meth)acrylate, and 1,4-bis(cyclopentyl) butyl-1,4-di(meth)acrylate.

Vinyl ether-derived groups $R_{11}$ (from $R_7$ and $R_8$), $R_{12}$, and polymer bound photoacid generator groups $R_{13}$ may be prepared by the reaction of an aliphatic or aromatic moiety appropriately functionalized with a vinyl ether, with a hydroxy group on a polymer. For example, a copolymer of 4-hydroxystyrene and styrene, or a copolymer of t-butyl acrylate, 4-hydroxystyrene and styrene, or a copolymer of 2-methyladamantyl methacrylate, 4-hydroxystyrene and styrene, may be treated with a vinyl ether such as, for example, 2-(2-vinyloxy)ethyl adamantanecarboxylate, 2-(2-vinyloxy)ethyl naphthalene-2-carboxylate, 2-(2-vinyloxy)ethyl naphthalene-2-carboxylate, 4,5-dihydropyranyl-5-methyl naphthalene-2-carboxylate, and/or a vinyl ether functionalized photoacid generator such as 2-(2-vinyloxy)ethyl-4-benzenesulfonimidatomethane triphenylsulfonium salt, or a combination comprising at least one of these, in the presence of a catalytic amount of acid (e.g., trifluoroacetic acid) and low moisture content (<0.1% w/w) in a solvent including ethers such as tetrahydrofuran, dioxane, or 1-methoxy-2-propyl acetate. The vinyl ether derivatized polymer may be used as a solution in a suitable solvent useful in preparing photoresist compositions, or may be isolated as a solid by precipitation or spray-drying.

A photoresist is prepared from the copolymer. The photoresist may include, in addition to the copolymer, a solvent, a photo-destroyable base, a surfactant, and additives including an additional photoacid generator, dissolution rate inhibitors, and sensitizers.

Solvents include those suitable for use in photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist may further include a photo-destroyable base. Inclusion of base materials, preferably the carboxylate salts of photo-decomposable cations, provides a mechanism for neutralization of acid from the acid decomposable groups, and limits the diffusion of the photogenerated acid, to thereby provide improved contrast in the photoresist.

Exemplary photo-destroyable bases include photo-decomposable cations, and preferably those useful for preparing PAGs, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Exemplary photo-destroyable bases include those combining cations and anions of the following structures where the cation is triphenylsulfonium or one of the following:

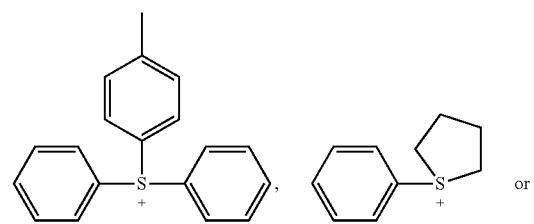

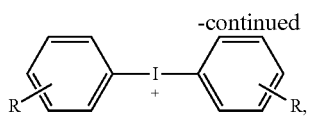

where R is independently H, a $C_{1-20}$ alkyl, a $C_{6-20}$ aryl, or a $C_{6-20}$ alkyl aryl, and the anion is

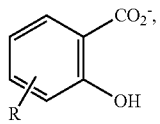

RC(=O)—O⁻, or ⁻OH,
where R is independently H, a $C_{1-20}$ alkyl, a $C_{1-20}$ alkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary such photobase is ortho-nitrobenzyl carbamate.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicyclo undecene (DBU) or diazabicyclononene (DBM), or ionic quenchers including quaternary alkyl ammonium salts such as tetrabutylammonium hydroxide (TBAH) or tetrabutyl ammonium lactate.

The photoresist composition disclosed herein may include the copolymer in an amount of 50 to 99 wt %, specifically 55 to 95 wt %, more specifically 60 to 90 wt %, and still more specifically 65 to 90 based on the total weight of solids. It will be understood that "copolymer" used in this context of a component in a photoresist may mean only the copolymer disclosed herein, or a combination of the copolymer with another polymer useful in a photoresist. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photo-destroyable base, quencher, surfactant, any added PAG, and any optional additives, exclusive of solvent.

The photoresist composition may be cast to form a layer on a substrate. In an embodiment a photoresist layer thus comprises the copolymer, a photo-destroyable base, and surfactant contacted to the surface of a substrate. Substrates may be any dimension and shape, and are preferably those useful for photolithography, such as silicon, silicon dioxide, strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including the PAG on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and is generally baked on a hot plate to further remove residual solvent and to remove free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. The pattern is formed after developing.

The photoresist may be used to fabricate electronic and optoelectronic devices such as memory devices, processor chips (CPU's), graphics chips, and other such devices.

The invention is further illustrated by the following examples.

All characterization by nuclear magnetic resonance spectrometry (NMR) was carried out using a Varian Anova 500 MHz NMR Spectrometer with Omni-Probe. Polymer composition was determined by quantitative $^{13}$C NMR at 125 MHz using NOE suppression techniques (pulse delay of >5 seconds). Molecular weight (Mw) and polydispersity (PD) were determined by gel permeation chromatography (GPC) using a sample concentration of 1 mg/ml and a crosslinked styrene-divinylbenzene column with universal calibration curve calibrated with polystyrene standards, and eluted with tetrahydrofuran at a flow rate of 1 ml/min Synthesis of 2-naphthoylethylvinyl ether (VE2)

In a 300 mL three necked oven dried round bottom flask equipped with a magnetic stirrer, 25 g (0.145 mol) of 2-naphthoic acid and 24.07 g (0.17 mol) of potassium carbonate ($K_2CO_3$) were suspended in 100 ml of dioxane and the mixture stirred at room temperature for 1 hour, forming a thick slurry. 18.53 g (0.17 mol) of 2-chloroethylvinyl ether dissolved in 10 ml of dioxane was slowly added to the reaction mixture using a dropping funnel over a period of 1 hour and the reaction refluxed overnight for another 12 hours until a complete reaction was ascertained by thin layer chromatography (TLC) analysis (silica plates; eluant 1% (v/v) methanol in chloroform). The reaction was quenched by pouring the mixture slowly into 400 ml of 0.01% (v/v) hydrochloric acid (HCl) solution, the crude product was extracted into 300 ml of ethyl acetate, and the ethyl acetate extract was washed sequentially with water and brine to neutral pH. The ethyl acetate extracts were then dried over sodium sulfate, filtered and concentrated by rotary evaporation to afford 32 g (92% yield) of an amber oil which solidifies upon standing. The product was used without further purification. $^1$H NMR (500 MHz, Acetone-$d_6$): δ 8.64 (s, 1H), 8.08 (d, 2H, 8 Hz), 7.89 (d, 2H, 8.5 Hz), 7.64-7.59 (q, 2H), 6.56-6.52 (d/d, 1H, 7 Hz), 5.58 (s, 1H), 4.60 (m, 2H), 4.49 (m, 2H), 2.30 (s, 3H), 1.90 (s, 3H). $^{13}$C NMR (125 MHz, CDCl$_3$): δ 166.6, 151.5, 135.6, 132.4, 131.3, 129.4, 128.3, 128.1, 127.7, 127.0, 126.6, 125.2, 87.1, 65.9, 63.3.

Synthesis of Polymer 1
(Poly(Hydroxystyrene/Styrene/Adamantyl carboxylate vinyl ether)

15 g of polyhydroxystyrene/styrene P(HS/Sty) 90/10 (mol/mol) resin (Mw 5,444 polydispersity (PD) of 1.28; available from Nisso Co.) was dissolved in 100 g of 1,3-dioxolane. About 20 g of the dioxolane solvent was distilled off under reduced pressure to remove residual water as an azeotrope from the solution. The solution was cooled and 9.38 g (0.0375 mol) of tris-2-(vinyloxy)ethyl-1-adamantyl carboxylate (ACVE; structure VE1, below, available from ENF Technology Co.) and 0.14 g (1.25 mmol) of trifluoroacetic acid (TFA) were added. The resulting mixture was stirred for 8 hours at room temperature. Upon completion (as determined by gas chromatography), the residual acid was neutralized by adding 1.25 mmol of 4-N,N-dimethylaminopyridine (DMAP). The resultant polymer was obtained by diluting the reaction mixture to 15% solids with tetrahydrofuran (THF) and precipitating the polymer by diluting the dioxolane/THF solution with a non-solvent (heptane) to afford a copolymer having a compositional ratio by $^{13}$C NMR (acetone-$d_6$) (62/11/27) of P(HS/Sty/ACVE) respectively, in quantitative yield (>99%). The P(HS/Sty/ACVE) had an Mw of 5,774 with a PD of 1.22.

Synthesis of Polymer 2
(Poly(Hydroxystyrene/Styrene/Adamantyl carboxylate vinyl ether/Naphthyl vinyl ether)

30 g of polyhydroxystyrene/styrene P(HS/Sty) 90/10 (mol/mol) resin (Mw 5,444 polydispersity (PD) of 1.28; available from Nisso Co.) was dissolved in 100 g of 1,3-dioxolane. About 20 g of the dioxolane solvent was distilled off under reduced pressure to remove residual water as an azeotrope from the solution. The solution was cooled and 3.8 g (0.016 mol) of 2-naphthoylethyl vinyl ether (NCVE; structure VE2, below), 12.51 (0.05 mol) of tris-2-(vinyloxy)ethyl-1-adamantyl carboxylate (ACVE; structure VE1, below, available from ENF Technology Co.) and 0.28 g of trifluoroacetic acid (TFA) were added. The mixture was stirred for 8 hours at room temperature. Upon completion of the reaction (as determined by gas chromatography), the residual acid was neutralized by adding 0.24 g (2.5 mmol) of triethylamine. The resultant polymer was obtained by diluting the reaction mixture to 15% solids with dioxane and precipitating the polymer by diluting the dioxolane/dioxane solution with a non-solvent (heptane) to afford a copolymer having a molar compositional ratio by $^{13}$C NMR (acetone-$d_6$) of 65/11/19/5 of P(HS/Sty/ACVE/NCVE) respectively in quantitative yields. The P(HS/Sty/ACVE/NCVE) had an Mw of 5,700 and a PD of 1.3.

Synthesis of Polymer 3
(Poly(Hydroxystyrene/Styrene/Naphthyl vinyl ether/4-vinyloxyethoxyphenyldiphenylsulfonium cyclo(1,3-perfluoropropanedisulfonium)imide salt)

10 g of polyhydroxystyrene/styrene P(HS/Sty) 90/10 (mol/mol) resin (Mw 5,444 polydispersity (PD) of 1.28; available from Nisso Co.) was dissolved in 100 g of tetrahydrofuran (THF). About 20 g of the THF solvent was distilled off under reduced pressure to remove residual water as an azeotrope from the solution. The solution was cooled in an ice bath and 4.0 g (0.016 mol) of 2-naphthoylethylvinylether (NCVE; structure VE2), 5.34 g (0.0083 mol) of 4-vinyloxyethoxyphenyldiphenylsulfonium cyclo(1,3-perfluoropropanedisulfonium)imide salt (Cy6VE; structure VE3, available commercially from Toyo Gosei Co. or as prepared according to the procedure detailed in U.S. Pat. No. 7,396,960 B2), and 0.093 g of trifluoroacetic acid (TFA) were added. The mixture was stirred for 12 hours at 40° C. Upon completion of the reaction (as determined by gas chromatography), the residual acid was neutralized by adding 0.08 g (0.79 mmol) of triethylamine. The resultant polymer was obtained by diluting the reaction mixture to 15% solids with THF and precipitating the polymer by diluting the THF solution with a non-solvent (heptane) to afford a copolymer having a molar compositional ratio by $^{13}$C NMR (60/11/20/9) of P(HS/Sty/NCVE/Cy6VE) respectively in quantitative yields. The P(HS/Sty/NCVE/Cy6VE) had an Mw of 5,800 with a PD of 1.3.

Synthesis of Polymer 4
(Poly(Hydroxystyrene/Styrene/Naphthyl vinyl ether/4-vinyloxyethoxyphenyldiphenylsulfonium cyclo(1,3-perfluoropropanedisulfonium)imide salt)

14 g of polyhydroxystyrene P(HS) resin (Mw 5,444 polydispersity (PD) of 1.28; available from Nisso Co.) was dissolved in 100 g of 1,3-dioxolane. About 50 g of the dioxolane solvent was distilled off under reduced pressure to remove residual water as an azeotrope from the solution. The solution was cooled in an ice bath and 22.32 (0.0348 mol) of 4-vinyloxyethoxyphenyldiphenylsulfonium cyclo(1,3-perfluoropropanedisulfonium)imide salt (Cy6VE; structure VE3, available commercially from Toyo Gosei Co., or as prepared according to the procedure detailed in U.S. Pat. No. 7,396,960 B2) and 0.06 g of trifluoroacetic acid (TFA) were added. The mixture was stirred for 12 hours at 50° C. Upon completion of the reaction (as determined by gas chromatography), the residual acid was neutralized by adding 0.06 g (0.59 mmol) of triethylamine. The resultant polymer was obtained by diluting the reaction mixture to 15% solids with THF and precipitating the polymer by diluting the THF solution with a non-solvent (heptane) to afford a copolymer having a molar compositional ratio by $^{13}$C NMR (80/20) of P(HS/Cy6VE) respectively in quantitative yield. The P(HS/Cy6VE) had an Mw of 5,500 with a PD of 1.3.

Synthesis of Polymer 5
(Poly(Hydroxystyrene/Styrene/Naphthyl vinyl ether/4-vinyloxyethoxyphenyldiphenylsulfonium cyclo(1,3-perfluoropropanedisulfonium)imide salt)

10 g of polyhydroxystyrene/styrene P(HS/Sty) 90/10 (mol/mol) resin (Mw 5,444 polydispersity (PD) of 1.28; available from Nisso Co.) was dissolved in 100 g of 1,3-dioxolane. About 50 g of the dioxolane was removed under reduced pressure to remove residual water as an azeotrope from the solution. The solution was cooled in an ice bath and 2 g (0.083 mol) of 2-naphthoylethylvinylether (NCVE; structure VE2), 5.34 g (0.0083 mol) of 4-vinyloxyethoxyphenyldiphenyl-sulfonium cyclo(1,3-perfluoropropanedisulfonium)imide salt (Cy6VE; structure VE3, available commercially from Toyo Gosei Co., or as prepared according to the procedure detailed in U.S. Pat. No. 7,396,960 B2) and 0.093 g of trifluoroacetic acid (TFA) were added. The mixture was stirred for 12 h at 50° C. The mixture was stirred for 12 hours at 50° C. Upon completion of the reaction (as determined by gas chromatography), the residual acid was neutralized by adding 0.06 g (0.6 mmol) of triethylamine. The resultant polymer was obtained by diluting the reaction mixture to 15% solids with THF and precipitating the polymer by diluting the THF solution with a non-solvent (heptane) to afford a copolymer having a molar compositional ratio by $^{13}$C NMR (70/11/10/9) of P(HS/Sty/NCVE/Cy6VE) respectively in quantitative yield. The P(HS/Sty/NCVE/Cy6VE) had an Mw of 5,800 with a PD of 1.2.

Positive-tone photoresist compositions were prepared using the above polymers 1-3 to evaluate the lithographic performance of each polymer. The formulations for the photoresists are described below. Each photoresist was processed and evaluated lithographically as follows. The photoresist was spin coated using a TEL ACT-8 (Tokyo Electron) coating track onto a 200 mm silicon wafer having an organic antireflective coating (AR™ 9, Rohm and Haas Electronic Materials LLC) and baked at 100° C. for 60 or 90 seconds to form a resist film of about 60 nm in thickness. The resulting photoresist layer was exposed patternwise to KrF excimer laser radiation (248 nm) or EUV radiation (eMET, 13.5 nm), post exposure baked at 90° C. for 60 seconds and developed with 0.26 N aqueous tetramethylammonium hydroxide developer solution to form a positive-tone photoresist pattern. The exposure doses required to provide a 1:1 resolution at the top and bottom of a 90 nm line-and-space pattern ($E_{size}$ at 90 nm L:S) are shown in Table 3. Linewidth and linewidth roughness (LWR) were determined by top-down scanning electron microscopy (SEM) using a Hitachi 9380 CD-SEM, operating at an accelerating voltage of 800 volts (V), probe current of 8.0 picoamperes (pA), using 200 Kx magnification at 1.0 digital zoom, with the number of frames set to 64. LWR was measured over a 2 μm line length in steps of 40 nm, and reported as the average LWR for the measured region.

Table 1, below, shows the different vinyl ethers used to prepare the acetal protecting groups.

TABLE 1

VE1
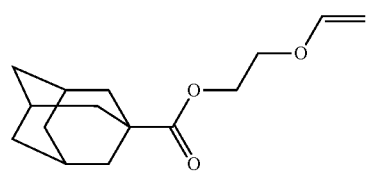 [SMILES: C=COCCOC(=O)C12CC3CC(CC(C3)C1)C2]

VE2
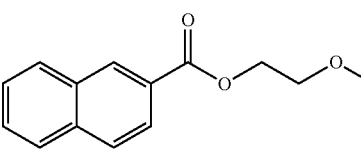

VE3
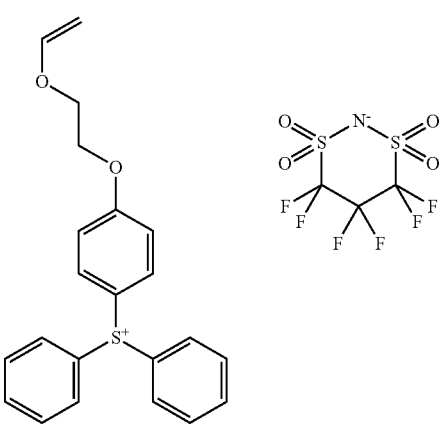 [SMILES: C=COCCOc1ccc([S+](c2ccccc2)c2ccccc2)cc1 ; O=S1(=O)[N-]S(=O)(=O)C(F)(F)C(F)(F)C1(F)F]

Table 2 shows a summary of the mole-percent of different vinyl ether blocking groups on the poly(hydroxystyrene-styrene) copolymers, used to form Polymers 1-3.

TABLE 2

| Example | Polymer | VE1 blocking ratio (mol % of monomers) | VE2 blocking ratio (mol % of monomers) | VE3 blocking ratio (mol % of monomers) |
|---|---|---|---|---|
| Comparative Example 1 | 1 | 27% | 0 | 0 |
| Example 1 | 2 | 19% | 5% | 0 |
| Example 2 | 3 | 0 | 20% | 9% |
| Example 3 | 4 | 0 | 0 | 31% |
| Example 4 | 5 | 0 | 10% | 10% |

The positive-tone photoresist compositions of the Comparative Example and Example 1 were prepared by combining in a mixture 2.22 g of Polymer 1 or 2 (respectively), 0.33 g of a 1 wt % a solution of OMNOVA PF656 surfactant in propylene glycol monomethyl ether acetate, 3.9 g of a 1 wt % solution of base additive (Troger's Base), 0.98 g of 4-hydroxyphenyldiphenylsulfonium cyclo(1,3-perfluoropropanedisulfonium)imide salt, 19.35 g of cyclohexanone and 73.5 g of ethyl lactate as solvent.

The positive tone photoresist composition of Examples 2-4 (corresponding to Polymers 3-5, respectively) were each prepared using 2.97 g of the polymer, 0.6 g of a 0.5 wt % a solution of OMNOVA PF656 surfactant in propylene glycol monomethyl ether acetate, 2.4 g of a 1 wt % solution of base additive (Troger's Base), 29.1 g of cyclohexanone and 64.93 g of ethyl lactate as solvent.

The photoresist of the Comparative Example was lithographically processed as follows. The formulated resist was spin coated onto silicon wafer (primed with hexamethyldisilazane (HMDS) or coated with a bottom antireflective coating) and soft baked at 100° C. for 60 seconds. The photoresist layer was exposed through a photomask with DUV or EUV radiation and the exposed layers were post-exposed baked (PEB) at about 90° C. for 60 seconds. The exposed wafers were then developed with a metal ion free base developer (0.26 N aqueous tetramethylammonium hydroxide solution) to form the relief pattern in the positive-tone resist layer.

Table 3 shows the lithographic results (dose-to-size) for each of the above Polymers 1-5 in their corresponding formulations. Note that 90 nm features were imaged using DUV radiation, and that the 27 nm features were imaged using EUV radiation. Linewidth roughness (LWR) results are also shown for the 27 nm L:S features.

TABLE 3

| Example | Polymer | $E_{size}$ at 90 nm L:S $(mJ/cm^2)^a$ | $E_{size}$ at 27 nm L:S $(mJ/cm^2)^b$ | LWR for 27 nm L:S $(nm)^b$ |
|---|---|---|---|---|
| Comparative Example | 1 | 6.2 | 6.0 | 7.4 |
| Example 1 | 2 | 5.2 | 5.6 | 6.2 |
| Example 2 | 3 | 6.4 | 6.3 | 4.8 |
| Example 3 | 4 | 4.8 | 3.8 | 3.8 |
| Example 4 | 5 | 4.0 | 3.4 | 4.2 |

$^a$248 nm (DUV) exposure.
$^b$13.5 nm (EUV) exposure.

As seen in Table 3 above, the photospeed of the Comparative Example at dose-to-size is slower (at 6.2 mJ/cm$^2$) than that of Example 1 (at 5.2 mJ/cm$^2$) with a combination of ACVE and NCVE (alkyl and aromatic) blocking groups, but slightly faster than Example 2 (at 6.4 mJ/cm$^2$) with a combination of NCVE and polymer bound PAG (Cy6VE), upon exposure at 248 nm sizing 90 nm L:S features. While this pattern is also seen for the Comparative Example (at 6.0 mJ/cm$^2$) and Examples 1 and 2 (at 5.6 and 6.3 mJ/cm$^2$, respectively) with EUV exposure at 27 nm L:S features, there is a decrease in dose-to-size for both DUV and EUV exposure of Example 3 (at 4.8 and 3.8 mJ/cm$^2$, respectively for DUV and EUV exposures, respectively) and for Example 4 (at 4.0 and 3.4 mJ/cm$^2$, respectively for DUV and EUV exposures). Both Example 3 and Example 4 have higher content (>9 mol %) of polymer-bound PAG VE3, particularly with respect to Example 2, but also when compared with the Comparative Example and Example 1, neither of which includes a polymeric PAG. Hence, higher loading of VE3 relative to VE2 provides improved photospeed under both DUV and EUV test conditions.

Linewidth roughness was also determined for the EUV exposures. It is seen that the highest LWR (7.2 nm) is obtained for the polymer having only an adamantane-based vinyl ether blocking group VE1, whereas inclusion of an aromatic blocking group VE2 further reduces the observed LWR (6.2 nm). Further, a trend in reduction of LWR can be seen in the sequence of Example 2 (Polymer 3, with 9 mol % VE3 and LWR of 4.8 nm), Example 4 (Polymer 5 with 10 mol % VE3 and LWR of 4.2 nm) and Example 3 (Polymer 4 with 31 mol % VE3 and LWR of 3.8 nm). In these Examples, reduction in LWR correlates independently to both increased loadings of polymer-bound PAG VE3, and to a lesser degree, to the use of an aromatic vinyl ether leaving group (VE2), where the highest loading of VE3 in the polymer exhibits the lowest LWR.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A copolymer having the formula:

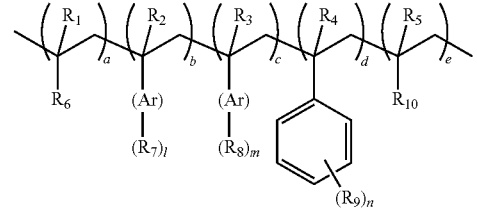

wherein $R_1$-$R_5$ are each independently H, $C_{1-6}$ alkyl, or $C_{4-6}$ aryl, $R_6$ is a fluorinated or non-fluorinated $C_{5-30}$ acid decomposable group; each Ar is independently a monocyclic, polycyclic, or fused polycyclic $C_{6-20}$ aryl group; each occurrence of $R_7$ is —$OR_{11}$ where $R_{11}$ is a fluorinated or non-fluorinated $C_{5-30}$ acid decomposable acetal group comprising a fluorinated or nonfluorinated $C_{6-25}$ aryl group; each occurrence of $R_8$ is independently —$OR_{11}$ or a —$C(CF_3)_2OR_{11}$ group where each occurrence of $R_{11}$ is independently H or a fluorinated or non-fluorinated $C_{5-30}$ acid decomposable group; each occurrence of $R_9$ is independently F, $C_{1-10}$ fluoroalkyl, or a $C_{1-10}$ fluoroalkoxy group; $R_{10}$ is a cation-bound $C_{10-40}$ photoacid generator-containing group of the formula

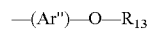

wherein Ar" is a $C_{6-20}$ monocyclic, polycyclic, or fused polycyclic aryl group, and

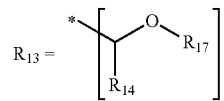

wherein $R_{14}$ is H or $C_{1-4}$ alkyl, and $R_{17}$ is

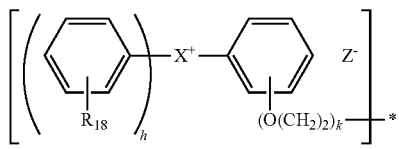

wherein $R_{18}$ is H or a $C_{1-10}$ organic group, X is S or I, and h is 2 when X is S, or h is 1 when X is I, and k is 1 to 4, and $Z^-$ is an anion; or $R_{10}$ is

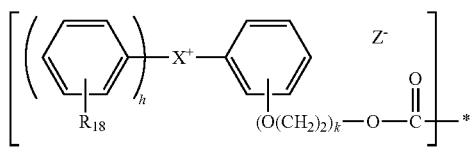

wherein $R_{18}$ is H or a $C_{1-10}$ organic group, X is S or I, and h is 2 when X is S, or h is 1 when X is I, k is 1 to 4, and $Z^-$ is an anion; mole fraction a is 0 to 0.80; mole fraction b is greater than 0 and less than or equal to 0.80; mole fraction c is 0.01 to 0.80; mole fraction d is greater than zero and less than or equal to 0.80; and mole fraction e is greater than 0 and less than or equal to 0.50; the sum of the mole fractions a+b+c+d+e is 1; 1 and m are independently integers of 1 to 4; and n is an integer of 1 to 5.

2. The copolymer of claim 1, wherein mole fraction a is greater than 0 and the fluorinated or non-fluorinated $C_{5-30}$ acid decomposable group of $R_6$ is a tertiary alkyl ester group.

3. The copolymer of claim 1, wherein the copolymer has the formula:

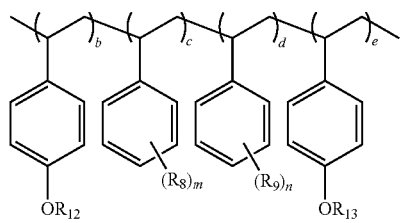

wherein $R_{12}$ is an acid decomposable acetal group comprising a fluorinated or non-fluorinated $C_{6-25}$ aryl group; each occurrence of $R_8$ is independently —OH or —C(CF$_3$)$_2$OH; each occurrence of $R_9$ is independently F, $C_{1-10}$ fluoroalkyl, or a $C_{1-10}$ fluoroalkoxy group; m is an integer of 1 to 4; n is an integer of 1 to 5; mole fraction b is 0.10 to 0.50; mole fraction c is 0.50 to 0.80; mole fraction d is 0.05 to 0.30; mole fraction e is 0.01 to 0.40; and the sum of the mole fractions b+c+d+e is 1.

4. The copolymer claim 1, wherein the copolymer is of the formula:

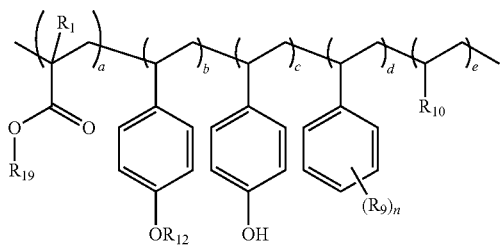

wherein $R_1$ is H or $C_{1-4}$ alkyl; $R_{12}$ is an acid decomposable acetal group comprising a fluorinated or non-fluorinated $C_{6-25}$ aryl group; $R_{19}$ is a fluorinated or non-fluorinated $C_{4-20}$ tertiary alkyl, a fluorinated or non-fluorinated $C_{4-20}$ tertiary cycloalkyl, or a fluorinated or non-fluorinated tertiary or benzylic $C_{6-20}$ aryl alkyl; each occurrence of $R_9$ is independently F, $C_{1-10}$ fluoroalkyl, or a $C_{1-10}$ fluoroalkoxy group; $R_{10}$ is a cation-bound $C_{10-40}$ photoacid generator-containing group of the formula —(Ar″)—O—$R_{13}$ wherein Ar″ is a $C_{6-20}$ monocyclic, polycyclic, or fused polycyclic aryl group, and

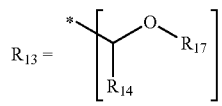

wherein $R_{14}$ is H or $C_{1-4}$ alkyl, and $R_{17}$ is

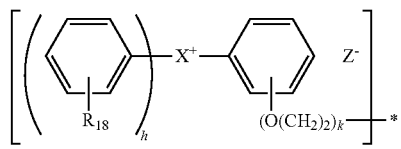

wherein $R_{18}$ is H or a $C_{1-10}$ organic group, X is S or I, and h is 2 when X is S, or h is 1 when X is I, and k is 1 to 4, and $Z^-$ is

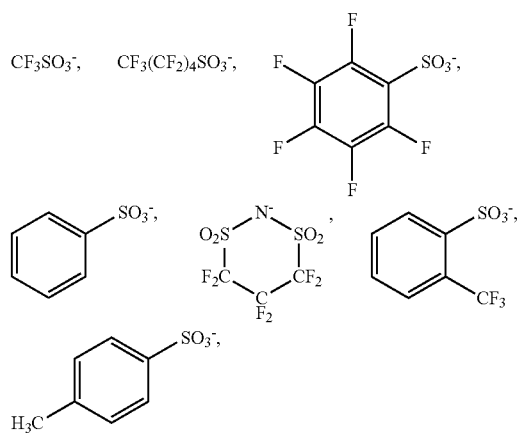

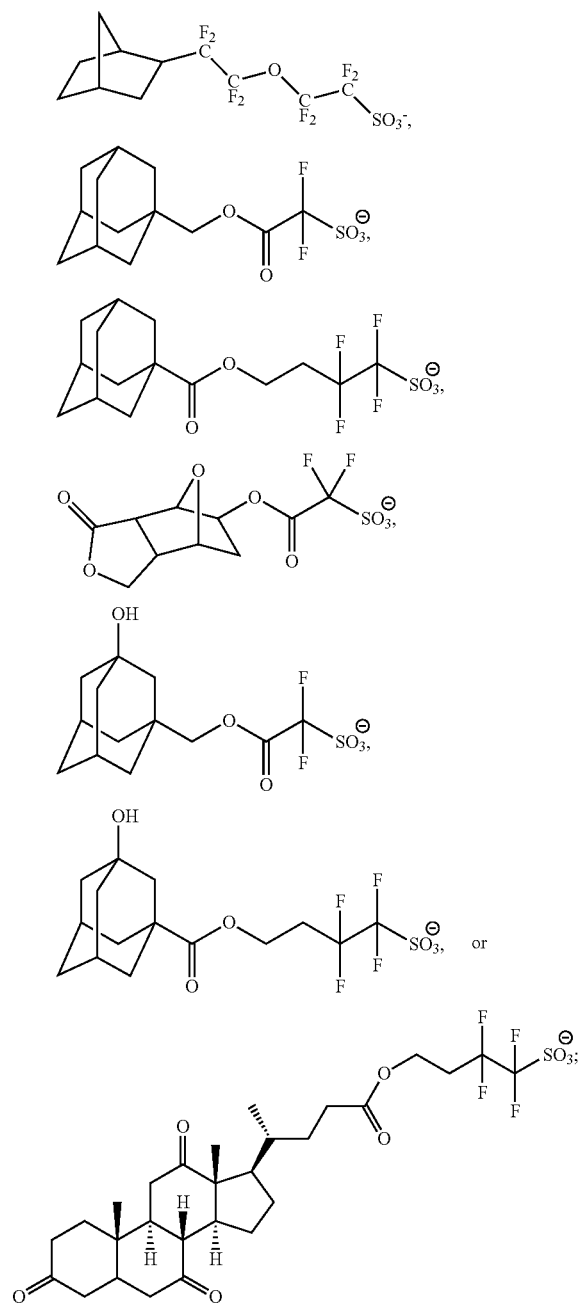
or R₁₀ is
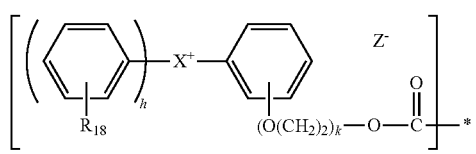
wherein R₁₈ is H or a $C_{1-10}$ organic group, X is S or I, and h is 2 when X is S, or h is 1 when X is I, k is 1 to 4, and Z⁻ is
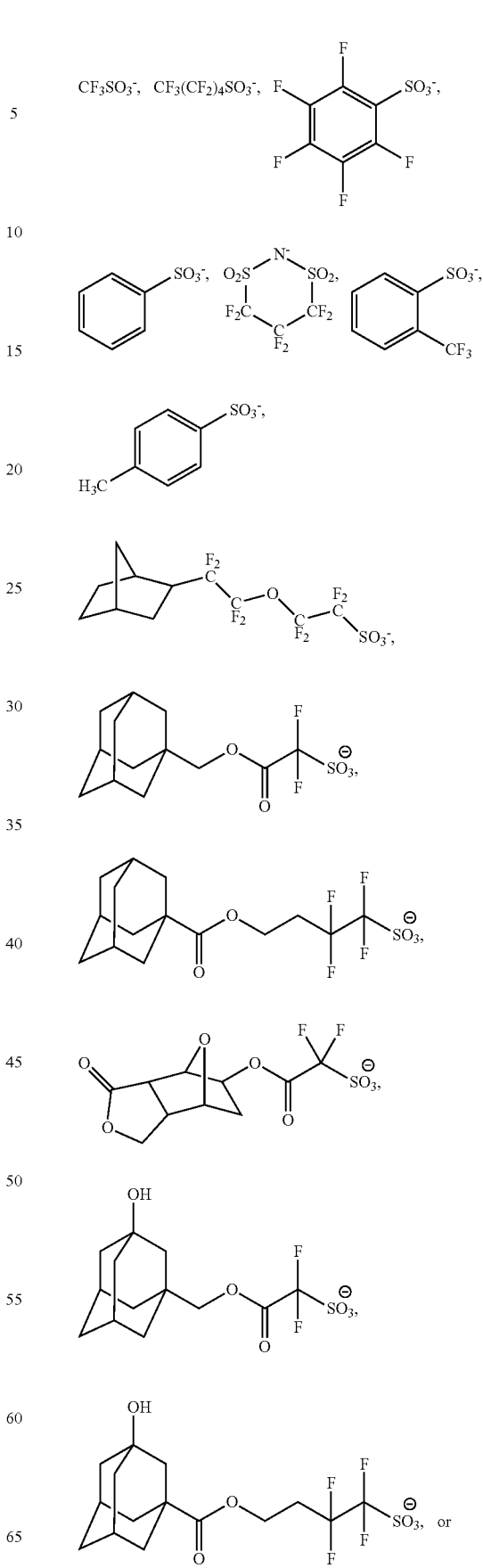

-continued

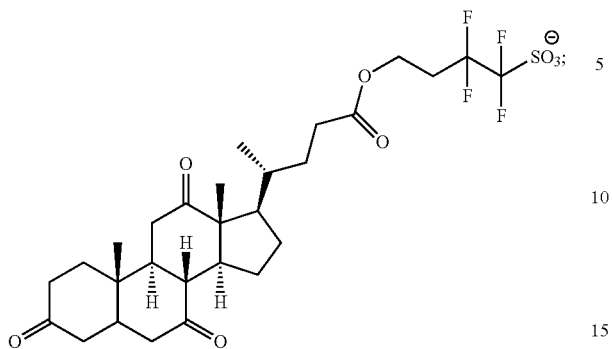

mole fraction a is 0 to 0.80; mole fraction b is greater than 0 and less than or equal to 0.80; mole fraction c is 0.01 to 0.80; mole fraction d is greater than zero and less than or equal to 0.80; and mole fraction e is greater than 0 and less than or equal to 0.50; the sum of the mole fractions a+b+c+d+e is 1; 1 and m are independently integers of 1 to 4, and n is an integer of 1 to 5.

5. The copolymer of claim 1, wherein $R_{10}$ is a cation-bound $C_{10-40}$ photoacid generator-containing group of the formula —(Ar")—O—$R_{13}$ wherein Ar" is a $C_{6-20}$ monocyclic, polycyclic, or fused polycyclic aryl group, and

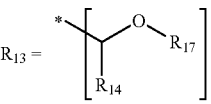

wherein $R_{14}$ is H or $C_{1-4}$ alkyl, and $R_{17}$ is

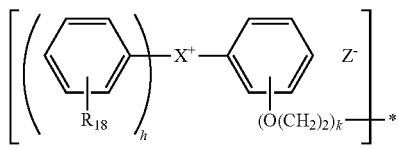

wherein $R_{18}$ is H or a $C_{1-10}$ organic group, X is S or I, and h is 2 when X is S, or h is 1 when X is I, and k is 1 to 4, and $Z^-$ is an anion.

6. The copolymer of claim 1, wherein $R_{10}$ is

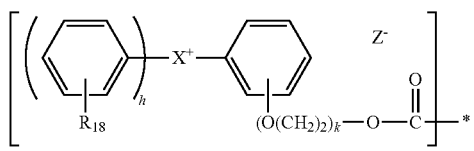

wherein $R_{18}$ is H or a $C_{1-10}$ organic group, X is S or I, and h is 2 when X is S, or h is 1 when X is I, k is 1 to 4, and $Z^-$ is an anion.

7. A photoresist composition, comprising:
a copolymer having the formula:

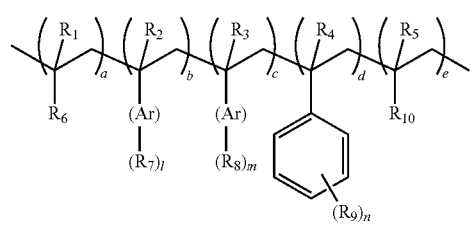

wherein $R_1$-$R_5$ are each independently H, $C_{1-6}$ alkyl, or $C_{4-6}$ aryl; $R_6$ is a fluorinated or non-fluorinated $C_{5-30}$ acid decomposable group; each Ar is independently a monocyclic, polycyclic, or fused polycyclic $C_{6-20}$ aryl group; $R_7$ is —$OR_{11}$ where $R_{11}$ is a fluorinated or non-fluorinated $C_{5-30}$ acid decomposable acetal group comprising a fluorinated or nonfluorinated $C_{6-25}$ aryl group; each occurrence of $R_8$ is independently —$OR_{11}$ or a —$C(CF_3)_2OR_{11}$ group where each occurrence of $R_{11}$ is independently H or a fluorinated or non-fluorinated $C_{5-30}$ acid decomposable group; each occurrence of $R_9$ is independently F, $C_{1-10}$ fluoroalkyl, or a $C_{1-10}$ fluoroalkoxy group; $R_{10}$ is a cation-bound $C_{10-40}$ photoacid generator-containing group of the formula

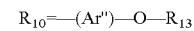

wherein Ar" is a $C_{6-20}$ monocyclic, polycyclic, or fused polycyclic aryl group, and

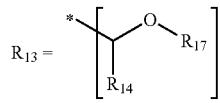

wherein $R_{14}$ is H or $C_{1-4}$ alkyl, and $R_{17}$ is

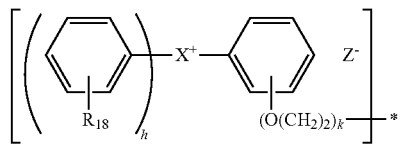

wherein $R_{18}$ is H or a $C_{1-10}$ organic group, X is S or I, and h is 2 when X is S, or h is 1 when X is I, and k is 1 to 4, and $Z^-$ is an anion; or $R_{10}$ is

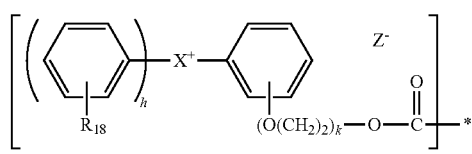

wherein $R_{18}$ is H or a $C_{1-10}$ organic group, X is S or I, and h is 2 when X is S, or h is 1 when X is I, k is 1 to 4, and $Z^-$ is an anion; mole fraction a is 0 to 0.80, mole fraction b is greater than 0 and less than or equal to 0.80, mole fraction c is 0.01 to 0.80, mole fraction d is greater than zero and less than or equal to 0.80; and mole fraction e is greater than 0 and less than or equal to 0.50, the sum of the mole fractions a+b+c+d+e is 1, l and m are independently integers of 1 to 4, and n is an integer of 1 to 5;
a photo-destroyable base;
a solvent; and
optionally, a non-polymer bound photoacid generator.

8. The photoresist composition of claim 7, wherein the photo-destroyable base comprises a cation comprising:

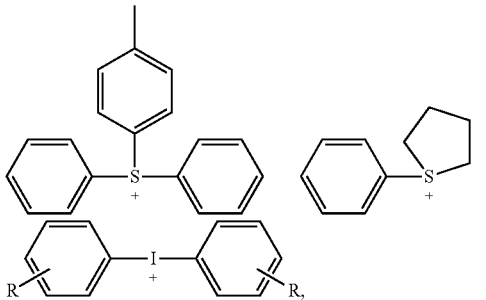

and
an anion comprising:

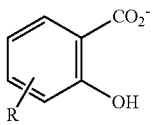

or

wherein each R in the cation or anion is independently H, a $C_{1-20}$ alkyl, a $C_{1-20}$ alkoxy, a $C_{6-20}$ aryl, or a $C_{6-20}$ alkyl aryl.

9. A method of forming an electronic device, comprising:
(a) applying a layer of a photoresist composition of claim 7 on a substrate;
(b) patternwise exposing the photoresist composition layer to activating radiation; and
(c) developing the exposed photoresist composition layer to provide a resist relief image.

10. The method of claim 9, wherein mole fraction a is greater than 0 and the fluorinated or non-fluorinated $C_{5-30}$ acid decomposable group of $R_6$ is a tertiary alkyl ester group.

11. The method of claim 9, wherein the copolymer has the formula:

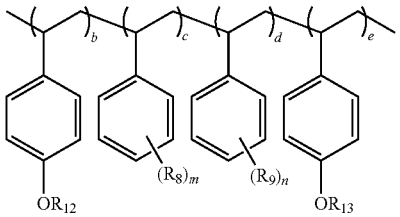

wherein $R_{12}$ is an acid decomposable acetal group comprising a fluorinated or non-fluorinated $C_{6-25}$ aryl group; each occurrence of $R_8$ is —OH or —C($CF_3$)$_2$OH; each occurrence of $R_9$ is independently F, $C_{1-10}$ fluoroalkyl, or a $C_{1-10}$ fluoroalkoxy group; m is an integer of 1 to 4; n is an integer of 1 to 5; mole fraction b is 0.10 to 0.50;

mole fraction c is 0.50 to 0.80; mole fraction d is 0.05 to 0.30 mole fraction e is 0.01 to 0.40 and the sum of the mole fractions b+c+d+e is 1.

12. The method of claim 9, wherein $R_{10}$ is a cation-bound $C_{10-40}$ photoacid generator-containing group of the formula

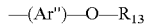

wherein Ar" is a $C_{6-20}$ monocyclic, polycyclic, or fused polycyclic aryl group, and

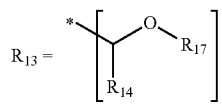

wherein $R_{14}$ is H or $C_{1-4}$ alkyl, and $R_{17}$ is

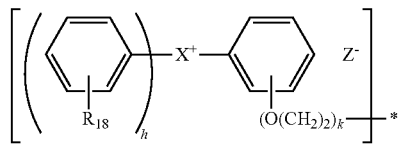

wherein $R_{18}$ is H or a $C_{1-10}$ organic group, X is S or I, and h is 2 when X is S, or h is 1 when X is I, and k is 1 to 4, and $Z^-$ is an anion.

13. The method of claim 9, wherein $R_{10}$ is

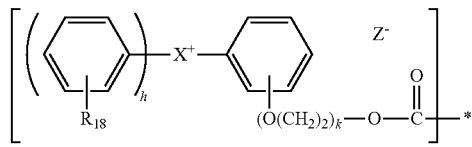

wherein $R_{18}$ is H or a $C_{1-10}$ organic group, X is S or I, and h is 2 when X is S, or h is 1 when X is I, k is 1 to 4, and $Z^-$ is an anion.

14. The method of claim 9, wherein the activating radiation is selected from e-beam and extreme ultraviolet.

15. The photoresist composition of claim 7, wherein mole fraction a is greater than 0 and the fluorinated or non-fluorinated $C_{5-30}$ acid decomposable group of $R_6$ is a tertiary alkyl ester group.

16. The photoresist composition of claim 7, wherein the copolymer has the formula:

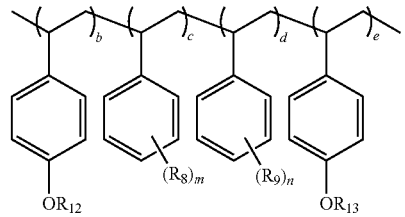

wherein $R_{12}$ is an acid decomposable acetal group comprising a fluorinated or non-fluorinated $C_{6-25}$ aryl group; each occurrence of $R_8$ is independently —OH or —C($CF_3$)$_2$OH; each occurrence of $R_9$ is independently F, $C_{1-10}$ fluoroalkyl, or a $C_{1-10}$ fluoroalkoxy group; m is an integer of 1 to 4; n is an integer of 1 to 5; mole fraction b is 0.10 to 0.50; mole fraction c is 0.50 to 0.80; mole fraction d is 0.05 to 0.30; mole fraction e is 0.01 to 0.40; and the sum of the mole fractions b+c+d+e is 1.

17. The photoresist composition of claim 7, wherein the copolymer is of the formula:

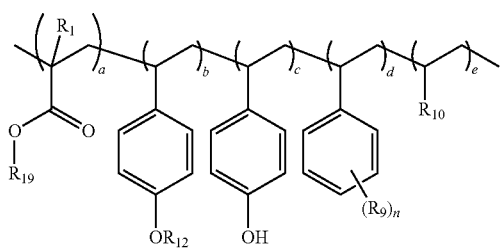

wherein $R_1$ is H or $C_{1-4}$ alkyl, $R_{12}$ is an acid decomposable acetal group comprising a fluorinated or non-fluorinated $C_{6-25}$ aryl group, $R_{19}$ is a fluorinated or non-fluorinated $C_{4-20}$ tertiary alkyl, a fluorinated or non-fluorinated $C_{4-20}$ tertiary cycloalkyl, or a fluorinated or non-fluorinated tertiary or benzylic $C_{6-20}$ aryl alkyl, each occurrence of $R_9$ is independently F, $C_{1-10}$ fluoroalkyl, or a $C_{1-10}$ fluoroalkoxy group; $R_{10}$ is a cation-bound $C_{10-40}$ photoacid generator-containing group of the formula

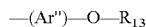

wherein Ar" is a $C_{6-20}$ monocyclic, polycyclic, or fused polycyclic aryl group, and

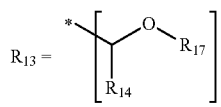

wherein $R_{14}$ is H or $C_{1-4}$ alkyl, and $R_{17}$ is

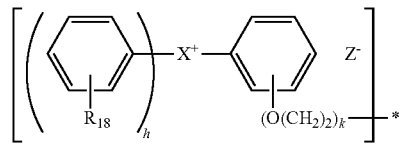

wherein $R_{18}$ is H or a $C_{1-10}$ organic group, X is S or I, and h is 2 when X is S, or h is 1 when X is I, and k is 1 to 4, and $Z^-$ is

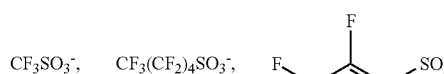
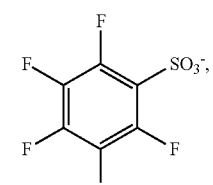
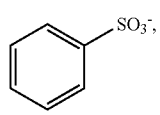 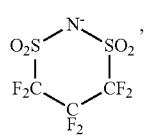 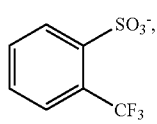

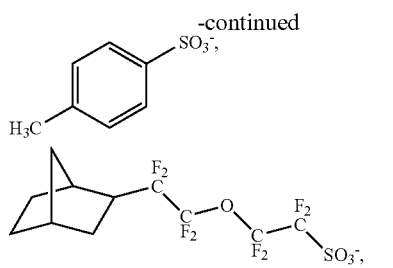
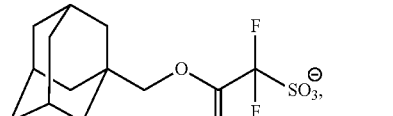
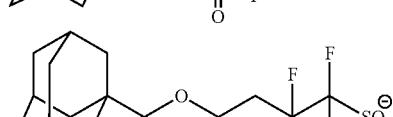
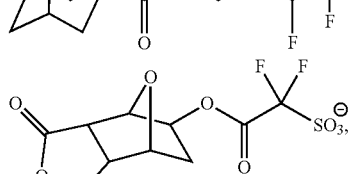
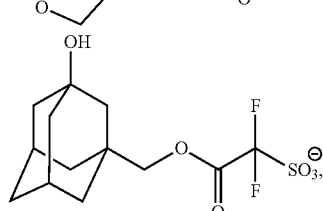
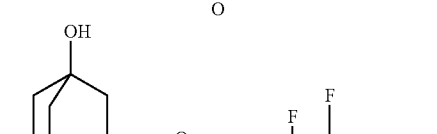

or $R_{10}$ is

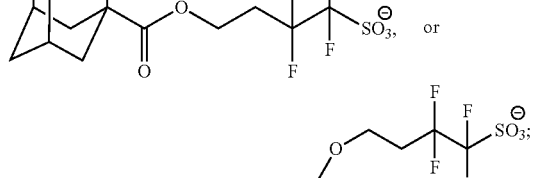
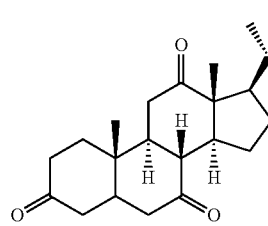

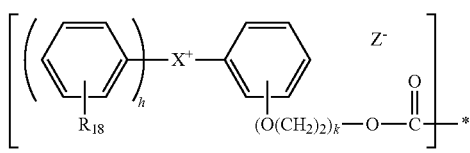

wherein $R_{18}$ is H or a $C_{1-10}$ organic group, X is S or I, and h is 2 when X is S, or h is 1 when X is I, k is 1 to 4, and $Z^-$ is

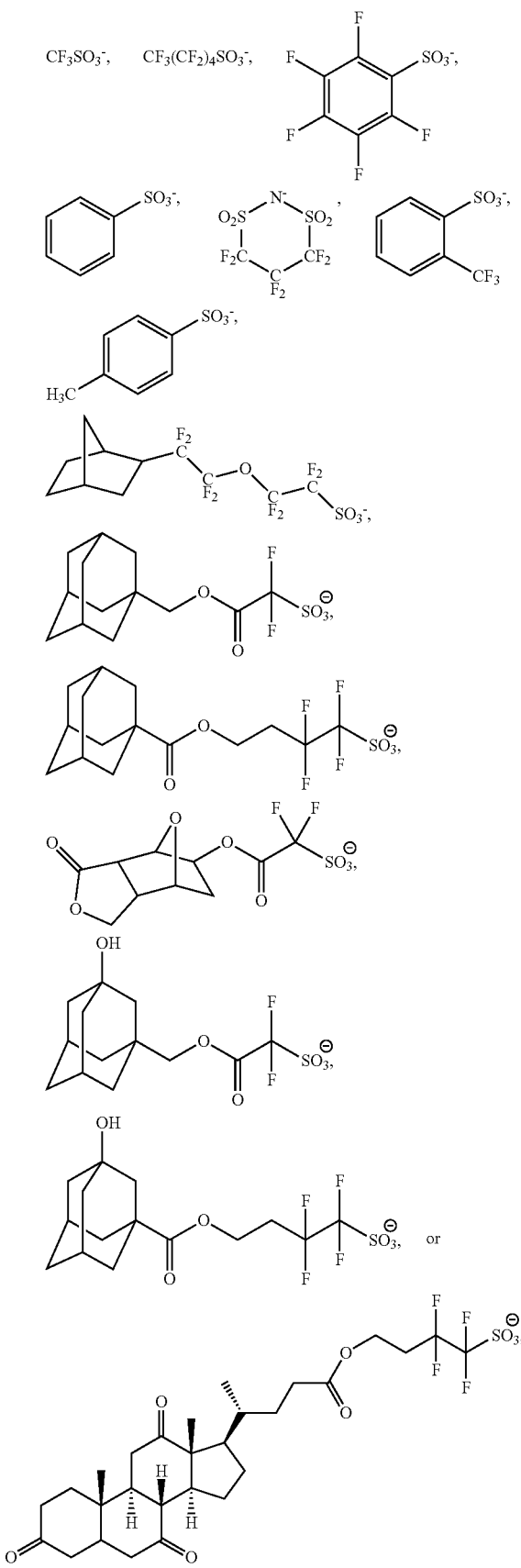

mole fraction a is 0 to 0.80; mole fraction b is reater than 0 and less than or equal to 0.80; mole fraction c is 0.01 to 0.80; mole fraction d is greater than zero and less than or equal to 0.80; and mole fraction e is greater than 0 and less than or equal to 0.50; the sum of the mole fractions a+b+c+d+e is 1; l and m are independently integers of 1 to 4, and n is an integer of 1 to 5.

18. The photoresist composition of claim 7, wherein $R_{10}$ is a cation-bound $C_{10-40}$ photoacid generator-containing group of the formula —(Ar'')—O—$R_{13}$ wherein Ar'' is a $C_{6-20}$ monocyclic, polycyclic, or fused polycyclic aryl group, and

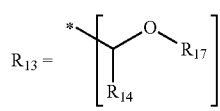

wherein $R_{14}$ is H or $C_{1-4}$ alkyl, and $R_{17}$ is

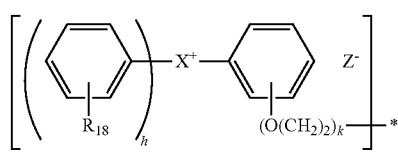

wherein $R_{18}$ is H or a $C_{1-10}$ organic group, X is S or I, and h is 2 when X is S, or h is 1 when X is I, and k is 1 to 4, and $Z^-$ is an anion.

19. The photoresist composition of claim 7, wherein $R_{10}$ is

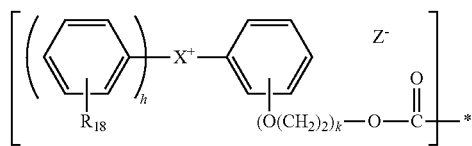

wherein $R_{18}$ is H or a $C_{1-10}$ organic group, X is S or I, and h is 2 when X is S, or h is 1 when X is I, k is 1 to 4, and $Z^-$ is an anion.

20. A coated substrate, comprising:
a photoresist layer comprising a photoresist composition comprising a copolymer having the formula:

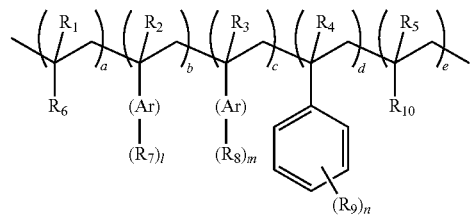

wherein $R_1$-$R_5$ are each independently H, $C_{1-6}$ alkyl, or $C_{4-6}$ aryl; $R_6$ is a fluorinated or non-fluorinated $C_{5-30}$ acid decomposable group; each Ar is independently a monocyclic, polycyclic, or fused polycyclic $C_{6-20}$ aryl group; each occurrence of $R_7$ is —$OR_{11}$ where $R_{11}$ is a fluorinated or non-fluorinated $C_{5-30}$ acid decomposable acetal group comprising a fluorinated or nonfluorinated $C_{6-25}$ aryl group; each occurrence of $R_8$ is independently —$OR_{11}$ or a —$C(CF_3)_2OR_{11}$ group where each occurrence of $R_{11}$ is independently H or a fluorinated or nonfluorinated $C_{5-30}$ acid decomposable group; each occurrence of $R_9$ is independently F, $C_{1-10}$ fluoroalkyl, or a $C_{1-10}$ fluoroalkoxy group; $R_{10}$ is a cation-bound $C_{10-40}$ photoacid generator-containing group of the formula

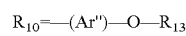

wherein Ar" is a $C_{6-20}$ monocyclic, polycyclic, or fused polycyclic aryl group, and

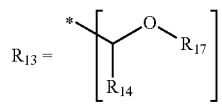

wherein $R_{14}$ is H or $C_{1-4}$ alkyl, and $R_{17}$ is

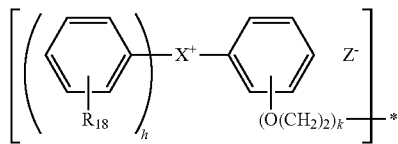

wherein $R_{18}$ is H or a $C_{1-10}$ organic group, X is S or I, and h is 2 when X is S, or h is 1 when X is I, and k is 1 to 4, and $Z^-$ is an anion; or $R_{10}$ is

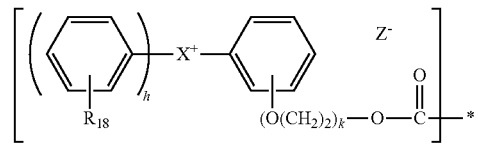

wherein $R_{18}$ is H or a $C_{1-10}$ organic group, X is S or I, and h is 2 when X is S, or h is 1 when X is I, k is 1 to 4, and $Z^-$ is an anion; mole fraction a is 0 to 0.80, mole fraction b is greater than 0 and less than or equal to 0.80, mole fraction c is 0.01 to 0.80, mole fraction d is greater than zero and less than or equal to 0.80, and mole fraction e is greater than 0 and less than or equal to 0.50, the sum of the mole fractions a+b+c+d+e is 1, l and m are independently integers of 1 to 4, and n is an integer of 1 to 5;

a photo-destroyable base; and optionally, a non-polymer bound photoacid generator;

wherein the photoresist layer is in contact with a surface of a substrate.

* * * * *